US006414371B1

(12) United States Patent
Freeman et al.

(10) Patent No.: US 6,414,371 B1
(45) Date of Patent: Jul. 2, 2002

(54) PROCESS AND STRUCTURE FOR 50+ GIGAHERTZ TRANSISTOR

(75) Inventors: Gregory G. Freeman, Hopewell Junction; Robert A. Groves, Highland, both of NY (US); Jeffrey Johnson, Essex Junction, VT (US); Seshadri Subbanna, Brewster, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 34 days.

(21) Appl. No.: 09/580,130

(22) Filed: May 30, 2000

(51) Int. Cl.$^7$ ................... H01L 27/082; H01L 21/331
(52) U.S. Cl. .................. 257/584; 257/587; 438/334
(58) Field of Search ..................... 257/565, 584, 257/587, 573; 438/205, 313, 340, 334

(56) References Cited

U.S. PATENT DOCUMENTS

| | | | | |
|---|---|---|---|---|
| 3,973,271 A | * | 8/1976 | Okumura et al. | 357/34 |
| 5,268,324 A | | 12/1993 | Aitken et al. | 437/57 |
| 5,338,698 A | | 8/1994 | Subbanna | 437/40 |
| 5,350,700 A | * | 9/1994 | Yang et al. | 437/31 |
| 5,406,114 A | * | 4/1995 | Brenndoerfer et al. | 257/584 |
| 5,455,448 A | * | 10/1995 | Benjamin | 257/565 |
| 5,965,930 A | * | 10/1999 | Sakamoto et al. | 257/584 |

OTHER PUBLICATIONS

Ahlgren et al.; "A SiGe HBT BiCMOS Technology for Mixed Signal RF Applicatins"; IEEE BCTM 12.3; 1997, pp. 195–197, Month unknown–Dec. ?
H. Kroemer, "Heterostructure Bipolar Transistors and Integrated Circuits"; Proceedings of the IEEE, vol. 70, No. 1, Jan. 1982; pp. 13–25.

Ahlgren et al.; "Device Reliablity and Repeatability of a High Perfomrance Si/SiGe HBT BiCMOS Technology";pp. 452–455 Year/Month Unknown.
U. Konig; "200 GHz Potential of Si–Based Devices" Solid State Phenomena vols 69–70 (1999); pp. 121–130 Month Unknown.
Subbanna et al.; "How SiGe Evolved into a Manuacturable Semiconductor Production Process"; 1999 IEEE International Solid State Circuits Conference; Digest of Technical Papers; 1999; pp. 66–68.
Lee et al.; "Deep Submicron Transferred–Substrate Heterojunction Bipolar Transistors"; Department of ECE, University of California, Santa Barbara; pp. 26–27 (Month/Year Unknown).
Groves et al.; "High Q Inductors in a SiGe BiCMOS Process Utilizing a Thick Metal Process Add–On Module"; IEEE BCTM 9.3; 1999; pp. 149–152. Sep.?
P. Russer; "Si and SiGe Millimeter–Wave Intergrated Circuits"; IEEE Transactions on Microwave Theory and Techniques, vol. 46, No. 5, May 1998, pp. 590–603.

(List continued on next page.)

*Primary Examiner*—David Nelms
*Assistant Examiner*—Tu-Tu Ho
(74) *Attorney, Agent, or Firm*—Whitham, Curtis & Christofferson, P.C.; Joseph P. Abate (57) ABSTRACT

High frequency performance of transistor designs is enhanced and manufacturing yield improved by removing and reducing sources of parasitic capacitance through combinations of processes from different technologies. After formation of collector, base and emitter regions on a substrate and attachment of a second substrate, the original substrate is wholly or partially removed, the inactive collector area is removed or rendered semi-insulating and wiring and contacts are made from the original back side of the chip. Dielectric material used in the manufacturing process can be removed to further reduce capacitance. The high frequency transistors can be bonded to CMOS chips or wafers to form BICMOS chips.

22 Claims, 7 Drawing Sheets

OTHER PUBLICATIONS

Tayrani et al.; "X–Band SiGe Monolithic Control Circuits"; 1998 Topical Meeting on Silicon Monlithic Integrated Circuits in RF Systems; Sep. 1998; pp. 126–133.

Subbanna et al.; "Integration and Design Issues in Combining Very–High–Speed Silicon–Germanium Bipolar Transistors and ULSI CMOS for System–on–a–Chip Applications"; IEDM 99; pp. 35.1.1–35.1.4, Sep. 1999.

Volant et al.; "Fabrication of High Frequency Passives on BiCMOS Silicon Substrates"; 0–7803–5687/X/00/$10.00 Ic) 2000 IEEE (Month Unknown).

Tokumitsu et al.; "Three–Dimensional MMIC Technology: A Possible Solution to Masterslice MMIC's on GaAs and SI"; IEEE Microwave and Guided Wave Letters, vol. 5. No. 11, Nov. 1995; pp. 411–413.

* cited by examiner

PROCESS AND STRUCTURE FOR 50+ GIGAHERTZ TRANSISTOR

BACKGROUND OF THE INVENTION

1. Field of the Invention

The present invention generally relates to high performance transistors operable to microwave frequencies and, more particularly, to high performance transistor designs compatible with MOS/CMOS field effect transistors in integrated circuit designs.

2. Description of the Prior Art

The increase in amount of information transferred or distributed electronically has generated a substantial demand for increased bandwidth of data processing arrangements and high frequency communication links. Computer clock frequencies in excess of 1 Gigahertz (GHz) have been projected within a relatively few years. Microwave frequencies up to 50 GHz are currently in use. High speed data links are currently operating at 40 Gigahertz and frequencies of 100 Gigahertz are foreseeable. Additionally, high frequency communication links provide some substantial advantages in that the radiation pattern from a relatively small antenna can be readily constrained to limit required transmission power and to reduce susceptibility to interception of a transmitted signal. Microwave frequencies also have other properties which are being exploited in an increasing variety of devices. Thus, the demand for extremely high performance transistors and integrated circuits containing them is increasing rapidly.

Accordingly, there have been many recent developments to increase the frequency of operation of transistors. It is known that many limitations on frequency of operation derive from parasitic capacitances and resistances which have been reduced only at substantial cost and which appear to have reached a point of diminishing returns. Relatively large performance improvements in intrinsic device (e.g. a theoretical device without parasitics) performance yields only a small increase in the performance of a corresponding realized transistor or circuit in which it is placed. Other efforts to increase operational frequency or bandwidth of transistors have largely concentrated on exotic materials and device complexity; both tending to increase transistor cost and the latter tending to reduce manufacturing yield due to the intricacy and/or criticality of transistor structures and correspondingly complex processes by which they are formed.

Further gains in operating frequency and bandwidth are complicated by a requirement for manufacturing compatibility with other types of transistors such as complementary metal-oxide-semiconductor (CMOS) field effect transistors in integrated circuits used as support signal processing circuitry at somewhat lower frequencies. Transistors capable of operating at microwave frequencies are invariably bipolar at the present time and integrated circuits including both types of transistors are referred to as BICMOS devices.

BICMOS devices require substantial process complexity for manufacture and, generally, many process steps required for bipolar devices are incompatible with CMOS and vice-versa, requiring block out masking and sequential processing steps for each type of transistor. The overall heat budgets of both types of devices must be closely coordinated and are often particularly critical for bipolar transistors. This results in extremely long and costly processes with relatively low manufacturing yield. Increased complexity of bipolar transistors to obtain higher performance can only be accommodated with extreme difficulty.

Further, compatibility with CMOS technology requires use of a lower resistivity substrate, which is a principal reason for poor performance as well as causing higher parasitic capacitances, noise, and the like. For limitation of parasitic capacitance, the substrate should ideally function only as a thermal heat sink and mechanical support. However, it is not possible to obtain semi-insulating silicon with extremely high resistivity, as is the case with gallium arsenide.

SUMMARY OF THE INVENTION

It is therefore an object of the present invention to provide a simplified bipolar transistor design of high performance which is unconditionally compatible with CMOS in integrated circuits.

It is another object of the invention to provide a family of structures and manufacturing processes which can be employed singly or in any combination to improve the high frequency performance of most practical transistor designs and other electronic elements.

In order to accomplish these and other objects of the invention, a method of forming a high frequency electronic element such as a bipolar transistor, diode, FET or the like is provided including the steps of forming active regions such as a collector, base and emitter of the electronic element in one or more layers on a first substrate, forming contacts to selected ones of the active regions including support via structures, providing a second substrate on the contacts and the support via structures, removing a portion of the first substrate, patterning the respective layers including the active elements, and completing the transistor.

In accordance with another aspect of the invention, a high frequency transistor is provided including active regions comprising separated portions of respective layers, support vias including a contact formed on an active region, a metal layer formed over the contacts and support vias, and a substrate attached to at least one of the metal layer and the support vias.

In accordance with this method and structure, substantial material which can cause parasitic capacitance can be removed and connection length which can cause parasitic resistance and inductance can be reduced. Non-standard silicon processing techniques and microwave device processing techniques can be employed to further enhance high-frequency performance.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
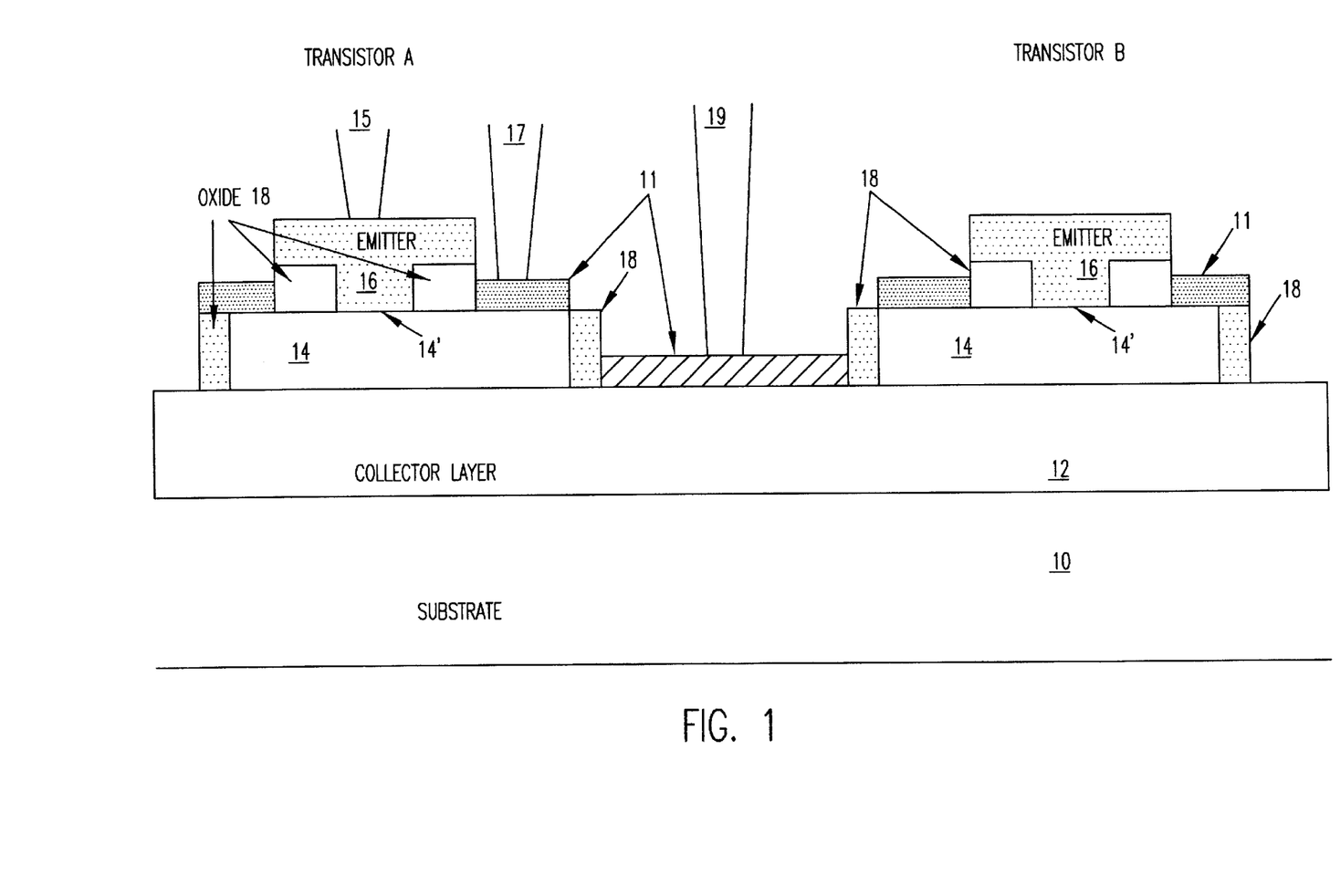
FIG. 1 is a cross-sectional view of two exemplary high performance transistors of arbitrary design formed on a substrate.

Referring now to the drawings, and more particularly to FIG. 1, there is shown, in cross-sectional view, two exemplary transistors of arbitrary design formed on a single substrate. The illustration of two transistors is intended to demonstrate that the invention is applicable to integrated circuit devices and to provide illustration of how some exemplary, generally desirable, features of the application of bipolar transistors to integrated circuits are accommodated and provided for some transistors to the exclusion of other transistors. Since the particulars of the transistor design depicted is intended to be arbitrary (and is substantially unimportant to the practice of the invention), no portion of FIG. 1 is admitted to be prior art as to the present invention, even though the invention is applicable to well-known transistor designs and the design depicted may resemble other known transistor structures.

The invention represents a substantial departure from current trends in developing increases in transistor performance. As alluded to above, the present trend is toward increasing complexity of transistor design having increasing process criticality. For example, a complicated combination of deep trench and shallow trench isolation is used in silicon bipolar and BICMOS technology to reduce parasitics and isolate the transistor from substrate noise effects. In the actual transistor design, extra layers such as a superlattice emitter or ballistic launch emitter layer may be added to increase performance; recovering, however, only a portion of the theoretical performance lost to parasitics. In contrast, the invention focuses on techniques for transistor construction which remove sources of parasitic capacitance and resistance from arbitrary transistor designs through combined processes from differing technologies.

The particular transistor designs for which the invention is suitable should be of relatively high-performance technology such as silicon-germanium based technology and relatively robust construction. Many such designs are known which are suitable for practice of the invention. Additionally, it has been found that the gains in performance achieved in accordance with the invention allow use with very simple, mechanically robust and reliably manufacturable transistor designs. Therefore, the invention provides techniques for obtaining lextremely high levels of performance and high frequency operation while significantly increasing manufacturing yield.

The principal sources of parasitic capacitance and resistance are capacitance between the collector of the transistor and the substrate on which it is formed, the capacitance of metal interconnects to the transistor, the collector to base capacitance of the transistor and the resistance in the collector contact wiring, the collector-to-substrate capacitance and the resistance and inductance in the emitter wiring. All of these sources of parasitic capacitance, resistance and inductance are readily visible in the exemplary transistor design shown in FIG. 1.

Specifically, The transistor structure of FIG. 1 includes vertical transistors formed on substrate 10. A continuous collector layer 12 is formed on the substrate and may or may not be insulated therefrom. Base regions 14 are formed directly on the collector layer 12 and emitter region 16 is formed to extend through an aperture in an insulator 18. A similar insulator 18 confines the base region. The locations at which the base contacts the collector and emitter form junctions. The portion of the base region 14 immediately adjacent to the emitter junction is referred to as the intrinsic base 14'and the remainder of the base region 14 is referred to as the extrinsic base. Silicide 11 provides base and collector contacts. Therefore, it is seen that there is a broad area of the collector layer 12 which is closely adjacent the substrate 10, forming a large parasitic capacitance.

Collector, base and emitter contacts are made through vias above those structures at silicide 11 and are parallel and separated by an insulator, generally of relatively high dielectric constant. These vias are connected to other metal connections in the integrated circuit and the combination of these conductors will present a significant further parasitic capacitance and inductance.

The base region 14 is also of substantial size to provide a contact thereto and the base-collector junction is reverse biased during operation of the transistor. Therefore significant parasitic capacitance will also be presented thereby.

Finally, the distance through the collector layer 12 between the junction with the intrinsic base 14'and the nearest possible location for a collector contact on silicide 11 is substantial and the doped semiconductor material thereof has significant specific resistance. Further, the contact 19 via to the collector is necessarily longer than contacts 17, 15 to the base and emitter (All shown with dashed lines in FIG. 1) but cannot be of increased cross-sectional area without increasing lithographic process complexity. Therefore, parasitic resistance and inductance in the collector contact circuit is significant.

In the interest of completeness, an exemplary method for forming the structure of FIG. 1 would be to start with a silicon wafer which can be of high resistivity, as desired. A collector layer 12 is then grown to a preferred thickness of 200–600 nm and may be doped in a patterned fashion, if desired, by any known technique. A base layer 14 can then be grown by, for example, low temperature ultra-high vacuum chemical vapor deposition (UHV-CVD) silicon-germanium epitaxy followed by an emitter layer 16 (e.g. lightly doped n-type or low-high doping, for example, an impurity concentration of $10^{15}$–$10^{18}$/cc followed by a concentration of more than $10^{19}$/cc during growth, to 50 to 500 nm). Sacrificial insulating films (used for patterning the emitter) such as 10 to 300 nm of oxide or nitride or a combination can be deposited and removed, as necessary.

The emitters 16 and extrinsic base 14 structures can then be patterned and delineated and the extrinsic base structure 14 completed by forming oxide sidewalls of 100 to 400 nm. followed by a boron implant of relatively high concentration (e.g. $10^{14}$/cc to $10^{16}$/CC at 10 to 40 KeV. The extrinsic base structure 14 can then be oxidized and opened to form an emitter protect area and the emitter structure of metal or polysilicon of 50–500 nm deposited. If required (e.g. if polysilicon not already doped in-situ) the emitter can then be doped (e.g. arsenic or phosphorus to about $10^{16}$/cc). The emitter 16 and base 14 areas may then be patterned and etched and the structure annealed (700°1000° C.) to activate the dopants and diffuse dopants in the emitter 16 and a silicide 11 formed on exposed contact surfaces, if desired. It should be recognized that these processes are well-known silicon processing steps.

Figure 2:
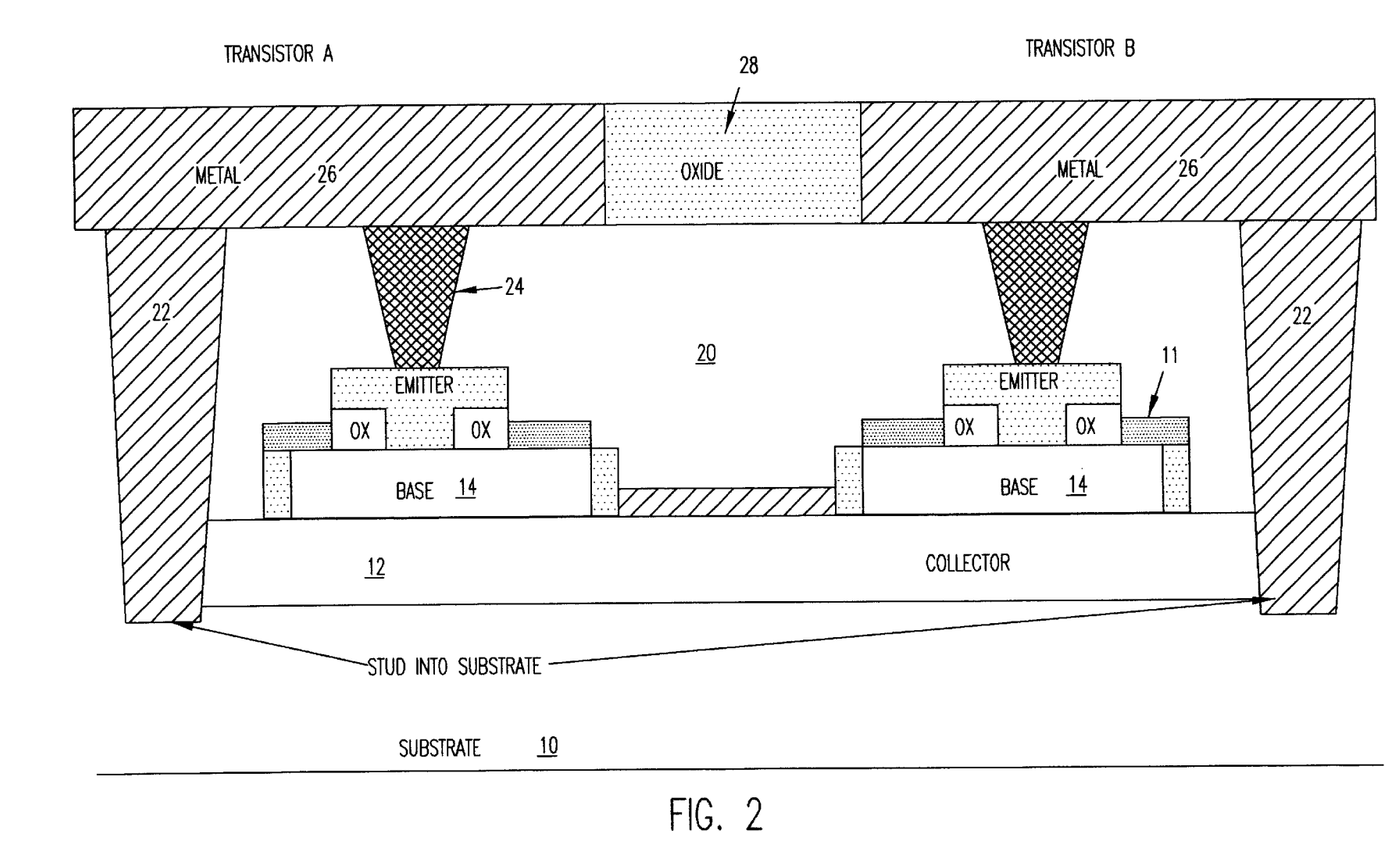
FIGS. 2, 3, 4, 5 and 6 are cross-sectional views of intermediate stages in fabrication of the invention.

Referring now to FIG. 2, an initial stage of fabrication of the structure and the process for doing so will now be explained. It will be appreciated that these steps are not standard silicon processing steps. First, a relatively thick (e.g. 1–4 microns) intermetal dielectric layer 20 of, for example, oxide or polyimide is spun on or otherwise applied to the structure of FIG. 1 and vias etched therein to the contact silicide 11 where contacts 24 are needed and through the collector layer 12 to substrate 10 at periodically spaced intervals to form supports 22. These vias are then filled with deposited metal such as copper and the structure planarized by chemical mechanical polishing, if desired. It should be noted in this regard that a metal layer 26 is allowed to remain. Portions of this layer are insulated from each other by oxide 28 which can be deposited and patterned prior to metal deposition or formed in etched trenches in layer 26. At this point, additional metal levels may be added as desired to the point that only external wiring is formed on the back of the chip. This metallization could be any silicon or compound semiconductor metallization, increasing process and manufacturing flexibility.

Figure 3:
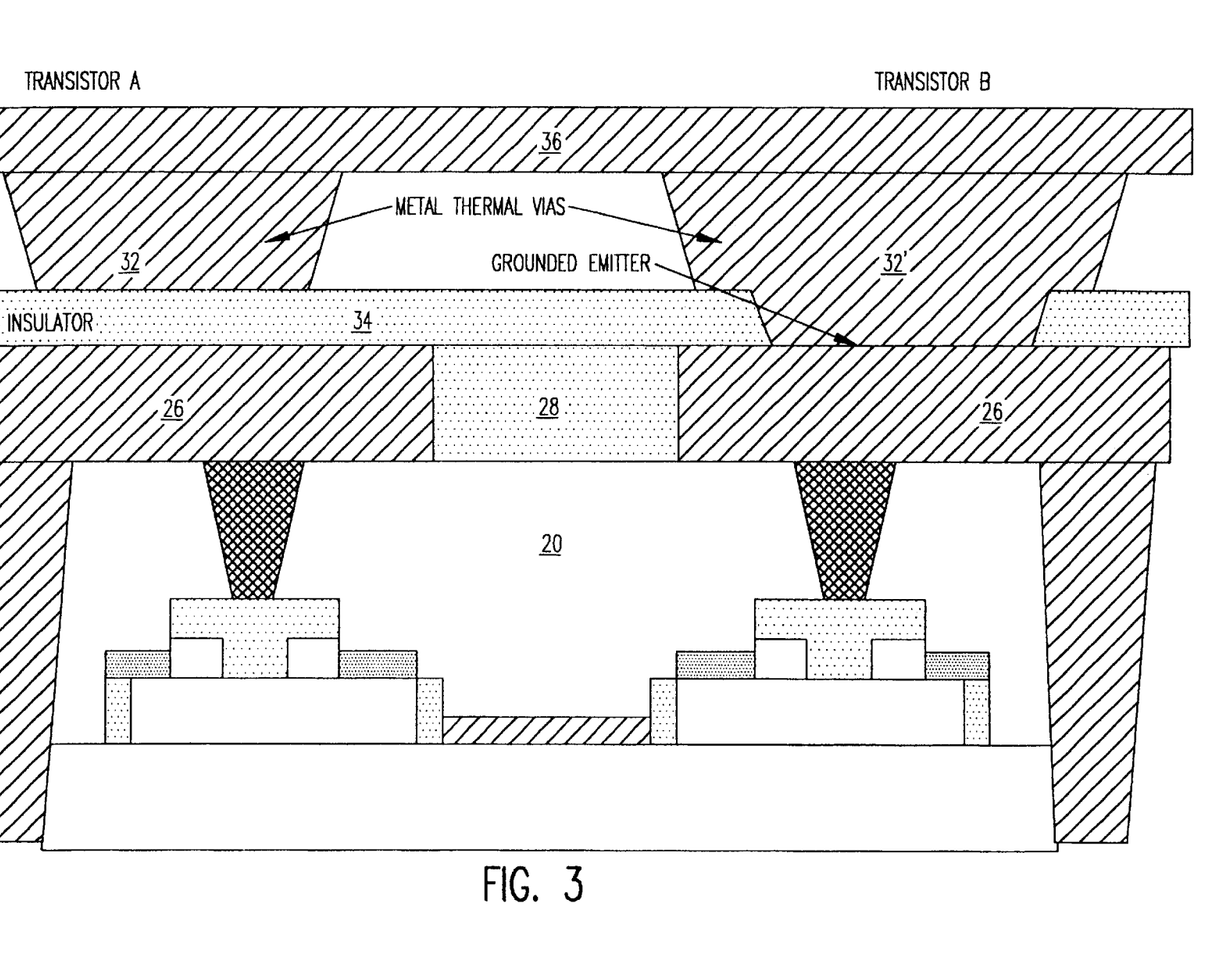

Referring now, to FIG. 3, a thermal transfer material film 32, 32' such as metal or sapphire and may be insulated by layer 34 from selected portions of layer 26 or not, as required by the design. An uninsulated grounded emitter is shown at 32' and ungrounded at 32. A further substrate such as a glass, quartz or metal wafer 36 is bonded thereto to enhance mechanical strength.

Figure 4:
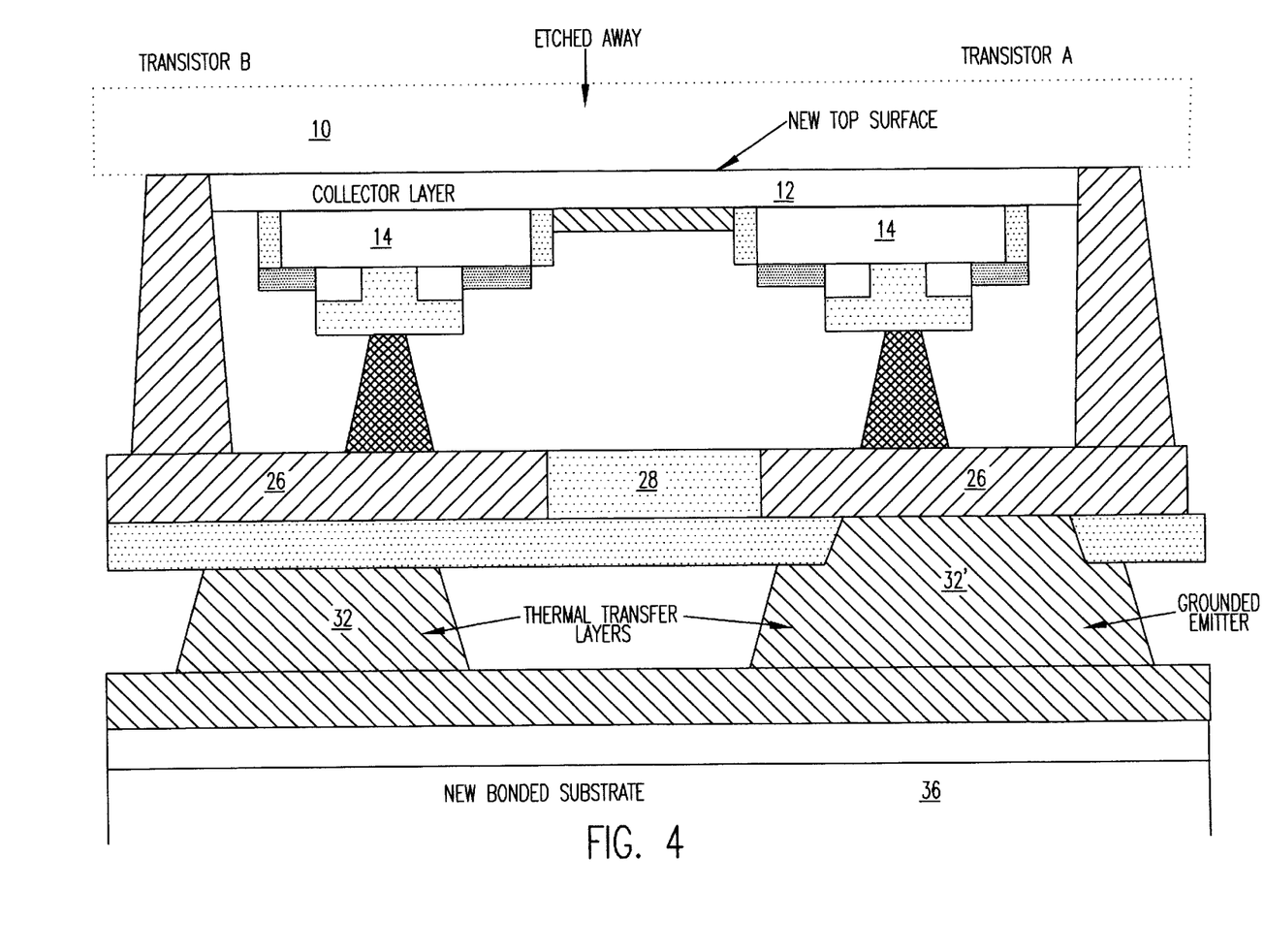

Then, as shown in FIG. 4, the structure of FIG. 3 is inverted and the original substrate 10 removed, preferably by etching, grinding or polishing or a combination thereof, leaving collector layer 12. A resist is then applied to collector layer 12 and patterned to cover the active areas and all silicon of inactive regions of collector layer 12 is then removed by etching or, alternatively, implanted with oxygen or other ions at 10–100 KeV and a concentration of $10^{14}$/cc to $10^{16}$/cc to form semi-insulating areas between active collector regions. Either of these processes substantially reduces collector capacitance to very low levels. The active collector regions are then provided with an arsenic or phosphorus implant dopant (e.g. $10^{12}$/cc to $5 \times 10^{14}$/cc at several hundred KeV in accordance with a patterned resist mask if needed and if such an impurity concentration has not been previously provided.

Figure 5:
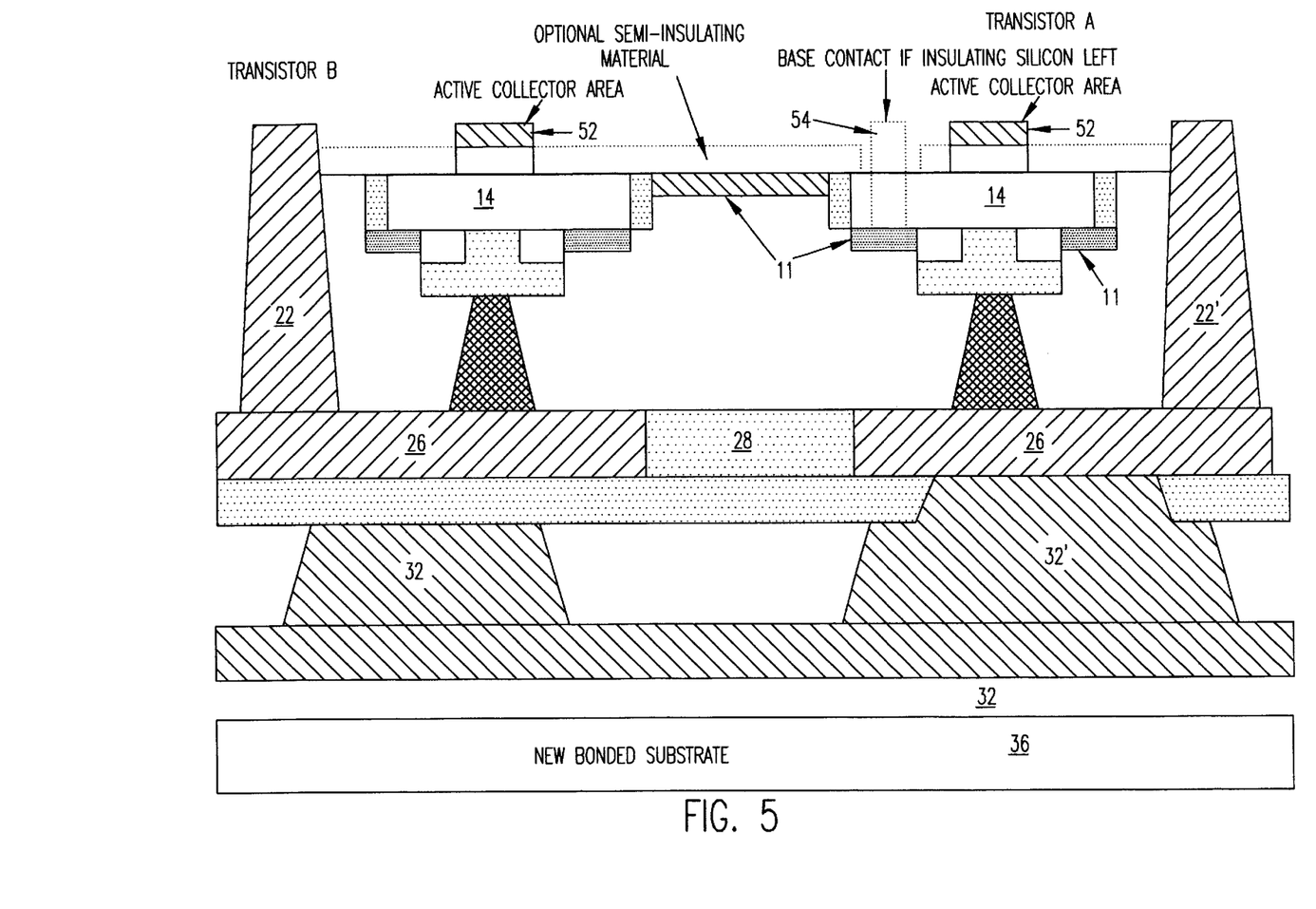

As shown in FIG. 5 another mask is then applied and patterned to establish all the contacts. In the case of oxygen implantation to isolate the active collector, an additional mask is used to remove collector silicon in and around the base contacts. The base layer 14 is exposed by removal of inactive silicon in the collector layer or by opening it after implantation to form a semi-insulator as described above. However, in either case, it is desirable to also open base layer to silicide 11 to improve the contact formation. Using the same mask, metal collector contacts 52 and base contact vias 54 may then be applied. It should be noted that the emitter contacts, whether grounded 22' or not 22 are exposed by removal of the original substrate 10 as discussed above in connection with FIG. 4.

Figure 6:
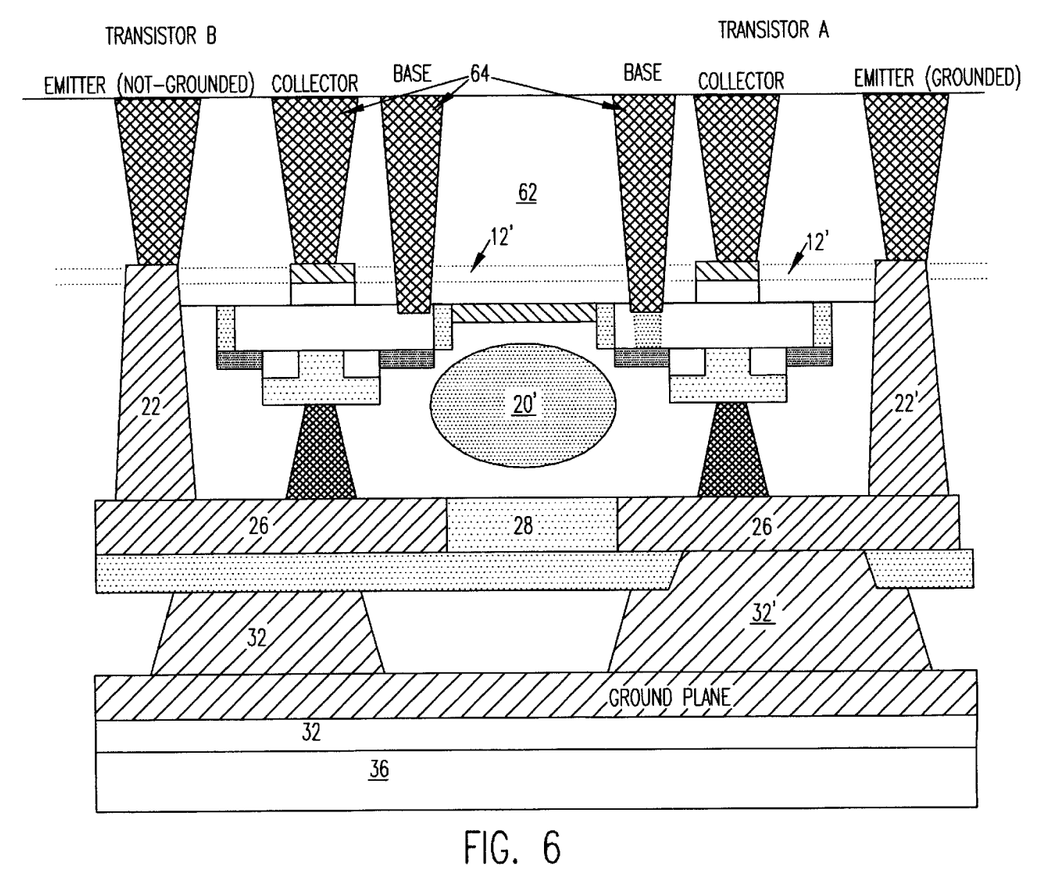
Figure 7:
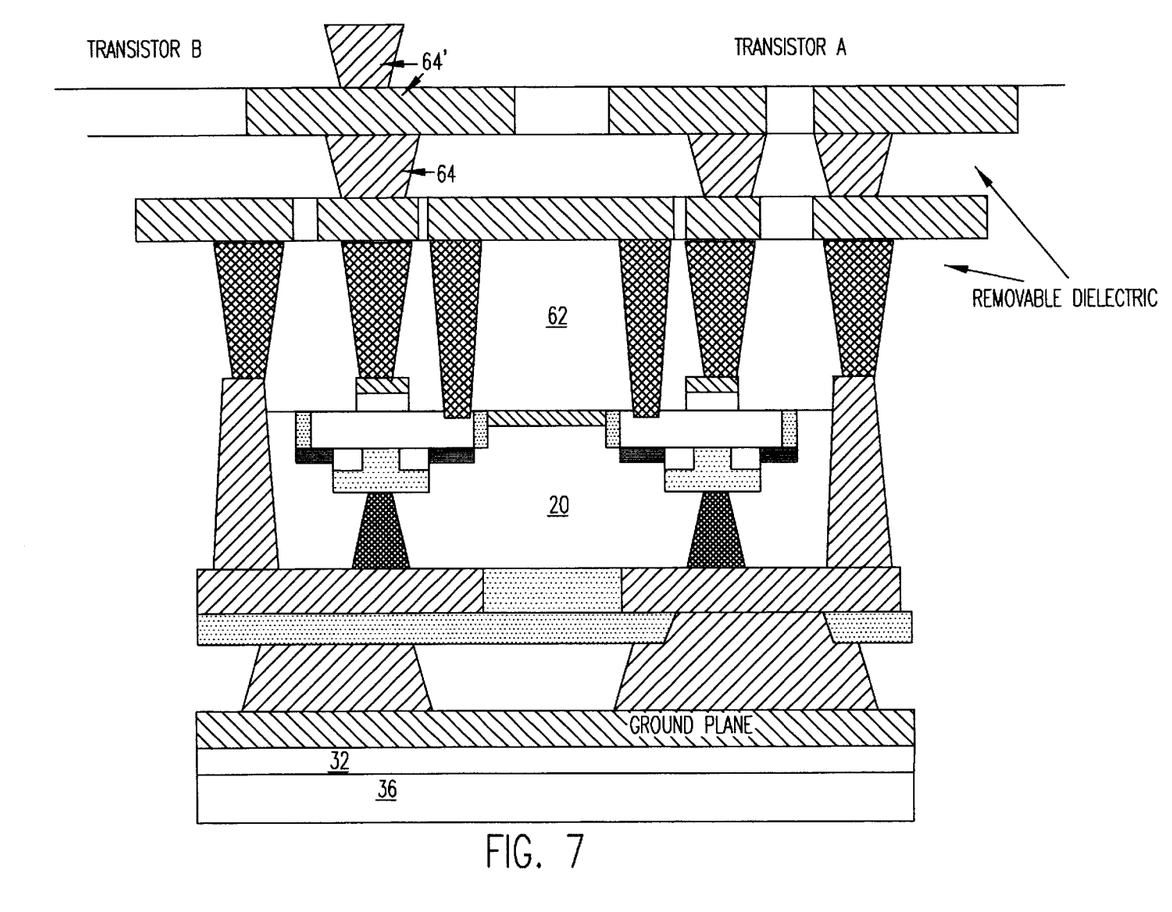
FIG. 7 is a cross-sectional view of a substantially complete structure in accordance with the invention and including the two transistors of FIG. 1.

As shown in FIG. 6, a further insulator layer 62 is applied and wiring level 64 (and 64' of FIG. 7) formed, as desired. Capacitance of the wiring levels can then be reduced by removal of insulators 62 and 20 using a wet or dry etch to form an air gap dielectric. Passivation, dicing into chips and packaging of the structure shown in FIG. 7 thus completes a fully integrated microwave sub-system in accordance with the invention. This sub-system can then be bonded to a chip or wafer (before or after dicing) on which, for example, CMOS circuitry has been formed to create a BICMOS device while maintaining the heat budgets for each technology completely separate and independent.

In view of the foregoing it is seen that the transistors in accordance with the invention provide a substantial reduction in all forms of parasitic capacitance and resistance which principally limit transistor switching speed. Specifically, substrate collector capacitance is eliminated by removal of original substrate 10, Base-collector capacitance is minimized by removal of inactive silicon or rendering it semi-insulating by an ion (e.g. oxygen) implant. The capacitance of interconnect metal and heat sink material is minimized by removal of dielectric material to form an air gap dielectric. Collector contact resistance is minimized by allowing the collector connection as well as the base and emitter connections from the original back side of the chip.

Structural robustness is provided by the heat sink layer and new bonded substrate at locations where little parasitic capacitance is created. Thus, the invention provides high performance bipolar transistors which are unconditionally compatible with CMOS integrated circuits to which they may be bonded and a family of processes which can enhance and optimize high frequency performance of any bipolar transistor design. In this regard, it should be recognized that the invention is also applicable to devices other than bipolar transistors, such as field effect transistors or any other device where parasitic capacitances, resistances, and inductances compromise high frequency performance. The invention is of wide applicability since it provides a technique and structure in which wiring length to contacts may be reduced to limit parasitic resistance and inductance while virtually all material which could be a source of parasitic capacitance may be removed and/or made to be of high resistance while other high performance features can be added, at will, in accordance with, for example, microwave device or other non-standard silicon fabrication techniques.

For example, after formation of high performance CMOS or BICMOS structures on a wafer, the wafer can be bonded to another wafer and the original substrate etched away, leaving only the devices and metallization without the structures which could form parasitic capacitances therewith. Similarly, active devices could be formed in accordance and then high-performance gold metallization applied in accordance with microwave device fabrication techniques. Another application and variation of the invention could include formation of high performance SiGe transistors and diodes, bonding to a support substrate and polishing away the original substrate to a desired thickness such that thick back side metallization of about 1 mm thickness (schematically depicted at 12' of FIG. 6) forms a waveguide with inserted active devices for power generation and the like. Likewise, a similar technique and structure with intermetal dielectric oxide or polyimide etching and metallization (e.g. at 20' of FIG. 6) could form completely shielded areas of microwave circuits.

While the invention has been described in terms of a single preferred embodiment, those skilled in the art will recognize that the invention can be practiced with modification within the spirit and scope of the appended claims.

We claim:

1. A method of forming a high frequency electronic element including the steps of forming active regions of said electronic element in one or more layers on a first substrate, applying an insulating layer on said active regions, forming contacts to selected ones of said active regions including support via structures, providing a second substrate on said contacts and said support via structures, removing a portion of the first substrate sufficient to reduce or eliminate a parasitic substrate-collector capacitance and resistance, patterning said one or more layers, and completing the transistor.

2. A method as recited in claim 1, wherein said patterning of said one or more layers includes selective ion implantation to render portions of said one or more layers semi-insulating.

3. A method as recited in claim 2, wherein said selective implantation implants oxygen ions into said one or more layers.

4. A method as recited in claim 1, wherein said patterning of said one or more layers includes selective removal of said one or more layers other than said active areas.

5. A method as recited in claim 4, wherein said removal of said one or more layers other than said active areas is performed by etching.

6. A method as recited in claim 1, wherein said step of removing a portion of said first substrate includes removal of a portion of a thickness of said first substrate.

7. A method as recited in claim 6, wherein said removal of a portion of a thickness of said first substrate is performed by polishing.

8. A method as recited in claim 1, wherein said step of removing a portion of said first substrate includes removing the entirety of said first substrate.

9. A method as recited in claim 1, including the further step of forming connections to said contacts.

10. A method as recited in claim 9, wherein said connections are formed in plural layers.

11. A method as recited in claim 6, including a further step of applying a thick metallization of a remaining portion of a thickness of said substrate.

12. A method as recited in claim 11, including the further steps of removing passivation material, and providing metallization where said passivation material has been removed.

13. A method as recited in claim 1, including a further step of removing insulating material to form an air gap dielectric.

14. A method as recited in claim 1 wherein said electronic element is a bipolar transistor and said active regions are a base, collector and emitter of said bipolar transistor.

15. A method as recited in claim 1, including the further step of forming integrated circuit elements formed on said second substrate.

16. A method as recited in claim 1, including the further step of forming a metallization layer over said contacts and support structures.

17. A high frequency transistor including active regions comprising separated portions of respective layers, support vias including a contact formed on an active region, a metal layer formed over said contacts and support vias, and a substrate attached to at least one of said metal layer and said support vias.

18. A transistor as recited in claim 17, wherein portions of a layer including said active areas includes an implanted material to form a semi-insulator in areas other than said active areas.

19. A transistor as recited in claim 17, further including a layer of thick metallization forming at least one of a microwave waveguide and shielding metallization.

20. A transistor as recited in claim 17, further including contacts to active areas other than said selected active areas extending from said active areas in a direction away from said substrate.

21. A transistor as recited in claim 20, further including a layer of connections to said contacts.

22. A transistor as recited in claim 21, wherein said connections include gold.

* * * * *